(12) United States Patent
Sebeni et al.

(10) Patent No.: US 8,194,782 B2
(45) Date of Patent: Jun. 5, 2012

(54) GROUPING BITS INTERLEAVING APPARATUS AND METHOD THEREOF

(75) Inventors: Johnson Sebeni, Taipei Hsien (TW); Dennis Peng, Taipei Hsien (TW)

(73) Assignee: VIA Technologies, Inc., New Taipei (TW)

( * ) Notice: Subject to any disclaimer, the term of this patent is extended or adjusted under 35 U.S.C. 154(b) by 1075 days.

(21) Appl. No.: 12/031,181

(22) Filed: Feb. 14, 2008

(65) Prior Publication Data

US 2009/0207946 A1    Aug. 20, 2009

(51) Int. Cl.
*H04L 27/00* (2006.01)

(52) U.S. Cl. ..................................... 375/295

(58) Field of Classification Search .................. 375/316, 375/340, 342, 295; 341/81; 345/540; 711/5, 711/127
See application file for complete search history.

(56) References Cited

U.S. PATENT DOCUMENTS

| | | | | |
|---|---|---|---|---|
| 6,405,286 | B2 * | 6/2002 | Gupta et al. | 711/127 |
| 2002/0035709 | A1 * | 3/2002 | Chen et al. | 714/702 |
| 2008/0126914 | A1 * | 5/2008 | Ikeda | 714/763 |

FOREIGN PATENT DOCUMENTS

WO    WO 01/24380    4/2001

OTHER PUBLICATIONS

Chinese First Examination Report of China Patent Application No. 2008100995457, dated Jan. 8, 2010.

* cited by examiner

*Primary Examiner* — Sam K Ahn
(74) *Attorney, Agent, or Firm* — J.C. Patents

(57) ABSTRACT

An grouping bits interleaver includes a grouping bits unit and a data storage unit. The grouping bits unit is used for storing N data bits of an input data and outputting an address signal. Wherein each data bit is stored according to a bit position. The data storage unit coupled to the grouping bits unit is used for saving the content of the grouping bits according to the address signal. Compared to the conventional interleaver, the grouping bits interleaver has better memory usage, less access time, and smaller memory size.

15 Claims, 16 Drawing Sheets

GROUPING BITS INTERLEAVING APPARATUS AND METHOD THEREOF

BACKGROUND OF THE INVENTION

1. Field of Invention

The present invention generally relates to an interleaving apparatus and method thereof, and more particularly to a grouping bits interleaving apparatus and method thereof.

2. Description of Prior Art

In digital communication systems, information to be transmitted is represented in bits. A bit is a binary digit that can take on two kinds of values namely "0" or "1". When one bit transmitted by the transmitter with a value is received but decoded as a different value in the receiver, a bit-error has occurred. This kind of error is caused by channel impairments like noise, interference, fading or any combination of them.

In most cases, noise, interference and fading impairments occur in bursts and can lead to more than one bit being in error consecutively. When bit-errors occur in consecutive received bits at the receiver end, a burst-error occurs. In most communication systems, forward error correction (FEC, hereafter) is a method that is used to detect and correct bit-errors, and thus the performances of communication systems will be improved.

However, the ability of FEC for correcting bit-errors is best when the bit-errors are not consecutive. In other words, isolated bit-errors can be more easily detected and corrected by the modem FEC algorithm, device or apparatus, while the consecutive bit-errors are not easily detected and corrected by the modem FEC algorithm, device or apparatus. Interleaving is a common algorithm in the digital communication system, which is used to spread the burst-error to multiple isolated bit errors. Using an appropriated FEC mechanism and an interleaving algorithm, these isolated errors can be corrected and the entire transmit message will be received correctly. At the transmitter end, the mechanism to do the interleaving algorithm is called interleaver; while in receiver end, the mechanism to do the de-interleaving algorithm is called de-interleaver.

Interleaving the transmitted bits and de-interleaving the received bits can spread a long burst-error into several single bit-errors or multiple shorter burst-errors. Then the following FEC algorithm will be more capable to correct these single bit-errors or shorter burst-errors than the longer burst-error.

Please see FIGS. 1A, 1B, 1C and 1D. FIG. 1A is a scheme diagram showing the procedure of writing data into the conventional interleaver 10. FIG. 1B is a scheme diagram showing the procedure of reading data from the conventional interleaver 10. FIG. 1C is a scheme diagram showing the procedure of writing data into the conventional de-interleaver 11. FIG. 1D is a scheme diagram showing the procedure of reading data from the conventional de-interleaver 11. The conventional interleaver 10 and de-interleaver 11 adapt the block-interleaving and block-de-interleaving algorithm.

As shown in FIGS. 1A and 1B, the interleaver 10 at the transmitter end interleaves a plurality of bits of the input data (input of the interleaver 10). The received bits to be interleaved will be written into a storage array (usually a memory) in sequence of rows, and be read from the storage array in sequence of columns.

In FIG. 1A, the input data (input of the interleaver 10) will be written to fill up one row in a fixed direction (see the arrows of FIG. 1A, like from left to right) before being written to the next row. After writing all the bits of the input data, column permutation may be done to sort of scattering the bits, and thus in the transmission the burst-error will be spread into multiple single bit errors or shorter burst-errors dispersedly. In FIG. 1B, the column permuted stored bits can be read out in sequence of columns. In other words, the data stored and permutated in the interleaver 10 will be read out in another fixed direction (see the arrows of FIG. 1B, like from top to bottom) for each column one by one. Thus the function of interleaving at the transmitter end is achieved.

As shown in FIGS. 1C and 1D, the de-interleaver 11 at the receiver end is directly opposite to that of the interleaver 10 at the transmitter end. Received data (symbols) of the de-interleaver 11 to be de-interleaved will be written into another storage array (i.e. the dimension of this storage array is same as that used at the transmitter end) in sequence of columns, and be read out from the storage array in sequence of rows.

In FIG. 1C, the de-interleaver 11 receives the data transmitted from the transmitter end, and the data will be written into the storage array in sequence of columns. Then the de-interleaver 11 de-permutes columns, wherein the de-permutation is opposite to the permutation of the interleaver 10. In FIG. 1D, the stored de-permuted data is read out in sequence of rows as de-interleaved output data from the de-interleaver 11. Thus the function of de-interleaving at the receiver end is achieved.

As stated above, data to be interleaved at the transmitter end are in unit of bits. At the transmitter end, one bit represents one datum. While at the receiver end, the data to be de-interleaved is mostly in the unit of symbols, and one symbol consists of several bits whereby the soft or multi-level values are used by the FEC decoder for better decoding. In some cases where the FEC decoder operates at the binary level, data to be de-interleaved can be in the units of bits. Thus at the receiver end, one bit or several bits represent one datum.

Generally speaking, the storage array (such as memory) is most efficiently composed of words (ex: 16 bits per word in WCDMA systems), where one word may consist of several bits such as 16, 32, or 64 bits. Therefore when designing a de-interleaver for a receiver using soft symbol FEC decoding, it is straightforward to use one word to store one symbol datum.

However, when designing an interleaver for a transmitter or a receiver using a binary FEC decoder, an inefficient usage of memory will occur if one word is still used to store only one bit datum. Besides, memory access time will be too much in such an implementation. With one word only containing one bit datum, the memory access times (i.e. consider writing access only) will be as many as the number of data bits. Additionally, a larger address space is needed.

In essence, the conventional block interleaving implementation using word-based memory suffers from poor memory usage, longer processing time, and larger address space. In order to improve the efficiency of the memory usage as well as access time, the embodiment of the invention provides an interleaving mechanism and a de-interleaving mechanism with the receiver using a binary FEC decoder to possess benefits in digital communication systems.

SUMMARY OF THE INVENTION

Accordingly, the present invention is directed to an interleaving apparatus and method thereof.

The present invention provides a grouping bits interleaver, and the grouping bits interleaver has better memory usage, less access time, and smaller memory size.

The present invention provides a grouping bits interleaver. The grouping bits interleaver includes a grouping bits unit and a data storage unit. The grouping bits unit is used for storing N data bits of an input data and outputting an address signal. Wherein each data bit is stored according to a bit position. The data storage unit coupled to the grouping bits unit is used for saving the content of the grouping bits according to the address signal.

According to the embodiments of the present invention, the grouping bits unit includes an address and bit position calculator. The address and bit position calculator is used for calculating the address signal and the bit position. The storage unit coupled to the address and bit position calculator is used for storing each data bit according to the bit position.

The invention provides a grouping interleaving method. First, store data bits of a received input data according to a corresponding bit position in a register bank, wherein the corresponding bit position is calculated before the storing. Then, save the content of the register bank in a data storage unit according to a calculated address signal.

In the embodiments of the present invention, saving the content of the register in the data storage unit is in response of the register bank is full or the corresponding bit position is equal to the preset value.

The present invention provides a grouping bits interleaver. The interleaver comprises n grouping bits units and a data storage unit. Each of the n grouping bits units is used to store a plurality of data bits of an input data according each of n bit positions and to output each of n address signals, wherein each data bit of the input data is stored according to the corresponding bit position. The data storage unit coupled to the n grouping bits units is used for saving content stored in each of the n grouping bits units according to the n address signals, respectively.

In the embodiments of the present invention, the interleaver further comprises a first switch, a second switch and a bit-reversed-order (BRO) operation circuit. The first switch coupled to the n grouping bits units is used for outputting one data bit of the input data into one of the n grouping bits units according to a first select signal. The second switch coupled to the n grouping bits units and the data storage unit is used for outputting the content stored in one of the grouping bits unit to the data storage unit according to the first select signal. The BRO operation circuit coupled to the first and second switch is used for receiving a plurality of least significant bits of a count signal and outputting the BRO of the least significant bits of the count signal, wherein a number of the least significant bits of the count signal is determined by n, and the first select signal is the BRO of the least significant bits of the count signal.

The present invention provides a grouping bits interleaving method used in a transmitter. First, provide n N-bit register banks. Then, provide a (N−1)-bit counter for counting a bit number of data bits of an input data, the number of the data bits is k, and the value of the least significant bits of k is m. Next, calculate n bit positions for the n N-bit register banks for storing n data bits respectively, and each of the n N-bit register banks stores the data bit according to each of the n bit positions. Finally, calculate n address signals when n N-bit register banks are full or the n bit positions are equal to n preset values, and then store the n contents of the n N-bit register banks into a buffer sequentially.

According to the embodiments of the present invention, the step of obtaining the n bit positions comprises the following sub-steps. First, do the BRO of m, and the value of the BRO of m is i. Then, provide n first (N−1)-bit counters with n different initial values. Finally, assign the n bit positions j=SymCount(i)[x:0]. Wherein i is from 1 to n, and SymCount(i)[x:0] means the value of the (x+1) least significant bits of the count number of the i-th first (N−1)-bit counter.

According to the embodiments of the present invention, the step of obtaining the n bit positions comprises the following sub-steps. When the SymCount(i)[x:0] is equal to N, the i-th address signal is a base-address -plus SymCount(i)[N−1:x+1]. Wherein SymCount(i)[N−1:x+1] means the value of the most significant bits of the count number of the i-th first (N−1)-bit counter from (N−1) to x+1.

The interleaver and interleaving method provided by the invention use grouping bits design, so as to improve the efficiency of the memory usage. Thus the memory of the grouping bits interleaver does not need a large size memory, and the access times of the memory are reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
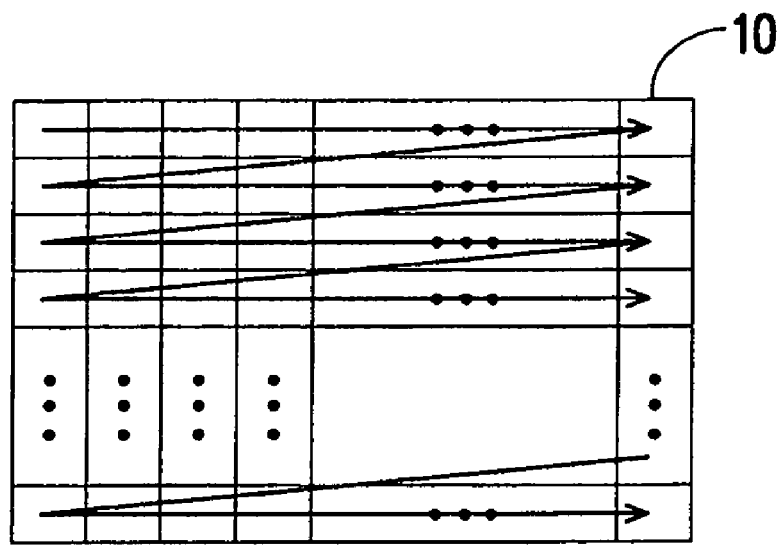
FIG. 1A is a scheme diagram showing the procedure of writing data into the conventional interleaver 10.
Figure 1B:
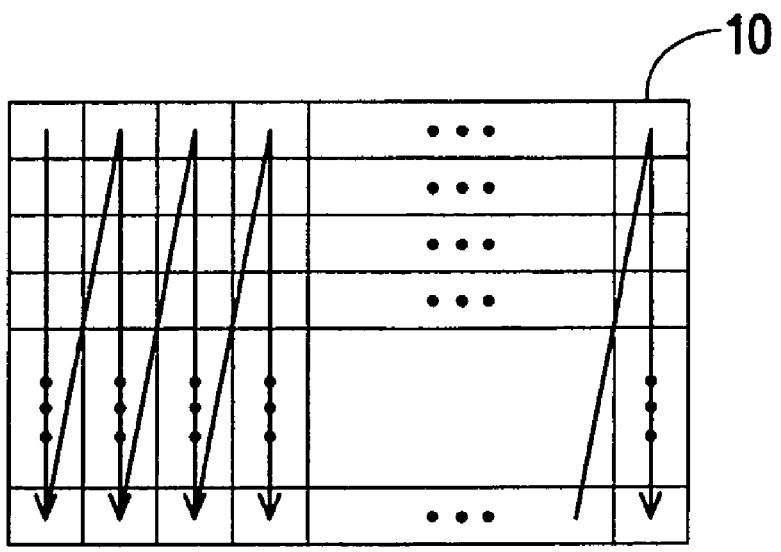
FIG. 1B is a scheme diagram showing the procedure of reading data from the conventional interleaver 10.
Figure 1C:
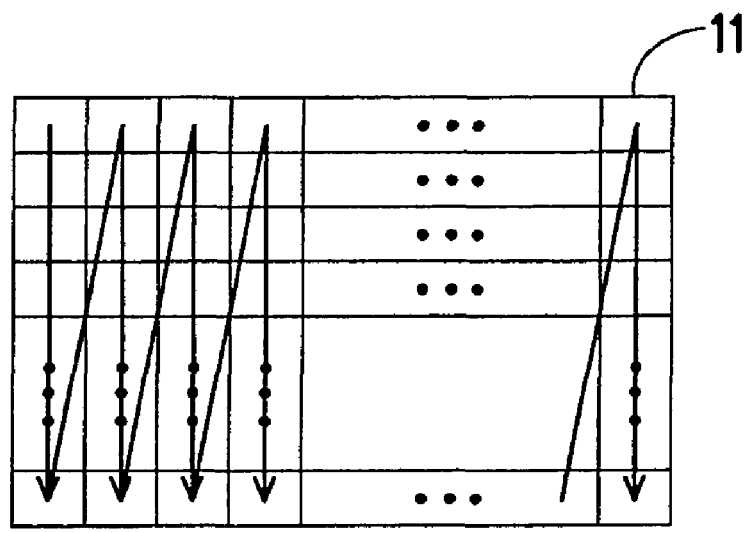
FIG. 1C is a scheme diagram showing the procedure of writing data into the conventional de-interleaver 11.
Figure 1D:
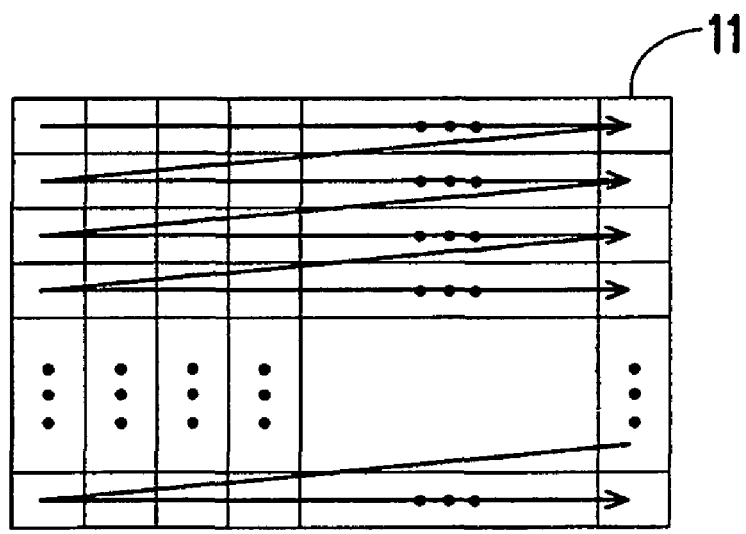
FIG. 1D is a scheme diagram showing the procedure of reading data from the conventional de-interleaver 11.

Reference will now be made in detail to the present preferred embodiment of the invention, examples of which are illustrated in the accompanying drawings. Wherever possible, the same reference numbers are used in the drawings and the description to refer to the same or like parts.

Figure 2:
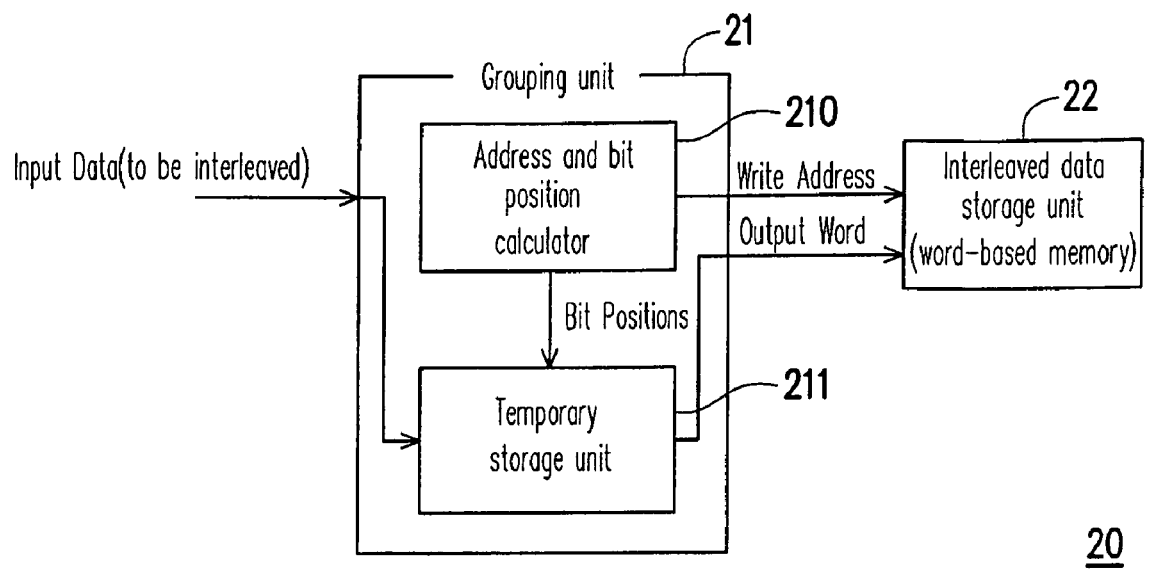
FIG. 2 is the basic block diagram showing one embodiment of the grouping bits interleaver 20.

FIG. 2 is a basic block diagram showing one embodiment of the grouping bits interleaver 20. The grouping bits interleaver 20 comprises a grouping bits unit 21 and an interleaved data storage unit 22. The grouping bits unit 21 is coupled to the interleaved data storage unit 22. In this embodiment, the interleaved data storage unit 22 is a word-based memory. However it is not intended to limit the scope of the invention, and in some cases, the interleaved data storage unit 22 is a specified-data-format-based memory for fulfilling the requirement. For example, the data storage unit 22 may be a byte-based or double word-based memory array.

The grouping bits unit 21 is used to temporarily store a plurality of encoded bits of the input data to be interleaved according to a bit position and output a write address. The interleaved data storage unit 22 is used to save the input data temporarily stored in the grouping bits unit 21 according to the write address.

The grouping bits unit 21 comprises an address and bit position calculator 210 and a temporary storage unit 211. The temporary storage unit 211 may be composed of a plurality of registers (not shown in the FIG. 2). The address and bit position calculator 210 is coupled to the temporary storage unit 211 and the interleaved data storage unit 22. The temporary storage unit 211 is coupled to the interleaved data storage unit 22.

The address and bit position calculator 210 is used to calculate the bit position and the write address. When each of the encoded bits is input into the grouping bits unit, the address and bit position calculator 210 calculate the bit position. And then the temporary storage unit 211 is used to temporarily store each of the encoded bits of the data according to the bit position currently calculated. In one instance, each register contains one bit memory. The bit position determines the corresponding register of the registers to temporarily store each encoded bit of the input data.

The input data to be interleaved is in unit of the encoded bits, and each unit will be processed one by one. Each input data to be interleaved will be first transferred into a temporary storage unit 211, which consists of several registers. The registers store the same number of bits as one word (ex: 16 bits per word in WCDMA systems) of the interleaved data storage unit 22. Once the registers are filled up, the whole contents of the registers will be transferred to the interleaved data storage unit 22 based on the write address. This procedure continues until all data to be interleaved are processed, and the whole interleaving process is finished.

In the application, the interleaver 20 furthermore comprises other grouping bits units (not shown in FIG. 2). The other grouping bits units are coupled to the interleaved data storage unit 22. The function of other grouping bits units is same as the grouping bits unit 21 as stated above. FIG. 2 is just an embodiment, and it is not intended to limit the scope of the invention.

Figure 3:
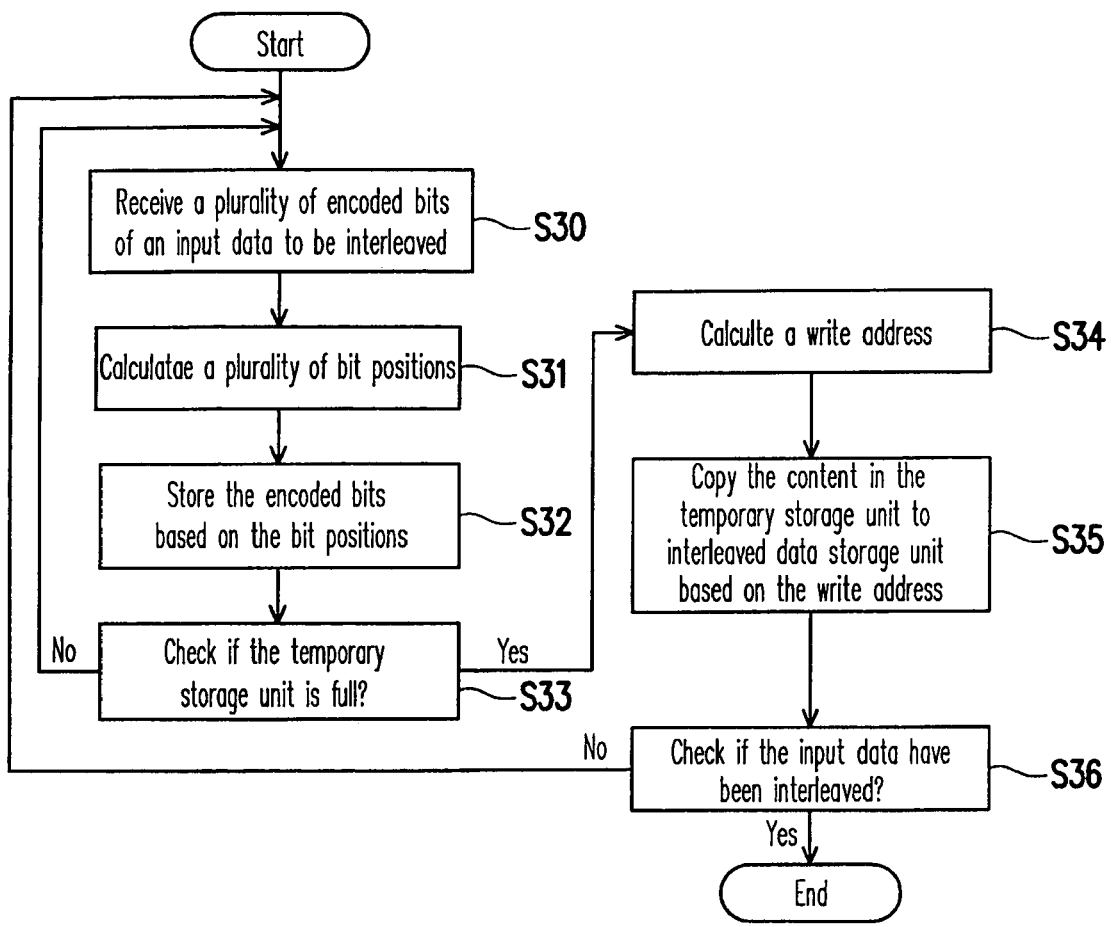
FIG. 3 is a flow chart diagram showing the procedure of the grouping bits interleaving method.

FIG. 3 is a flow chart diagram showing the procedure of the grouping bits interleaving method. In step S30, one input datum to be interleaved is received. In step S31, a bit position corresponding to the input datum is calculated by the address and bit position calculator. In step S32, the input datum is stored into the temporary storage unit based on the bit position. In step S33, if the temporary storage unit is full, then step S34 would be executed; otherwise step S30 would be repeated. In step S34, a write address is calculated by the address and bit position calculator. In step S35, the content temporary stored in the temporary storage unit is copied to the interleaved data storage unit based on the write address. In step S36, if all data have been interleaved, the procedure of interleaving method is finished; otherwise, step S30 would be repeated.

Since in many implementations, a word-based storage unit is commonly used as a final or temporary place to store interleaved data, such advantages as reduced address and storage space, simpler control logic, and reduced total memory access time can be derived by grouping enough encoded bits (datum) into a word before accessing the interleaved data storage unit for word storage. So the main benefit of this grouping bits design is to significantly reduce the access times of the interleaved data storage unit so that the memory usage can be more efficient and the required processing time can be reduced accordingly.

This interleaving mechanism can be easily applied to the 1st interleaving performed in WCDMA baseband according to the technical specification TS 25.212. Please see FIG. 4, which is a block diagram showing the application of the invention in the 1st interleaver 40 of WCDMA according to the specification TS 25.212. In this implementation, Ei denotes the total number of bits to be interleaved, C1 denotes the total number of columns to be used in the block interleaver and R1 denotes the total number of rows. The number of columns is as the same as the length of the Transmission Time Interval (TTI, hereafter). The number of rows is chosen to be the minimum value such that all of the Ei bits can be written into the block. In other words, R1*C1=Ei in some embodiments.

Since more than one transport channel may be stored, a base address parameter is also given as shown below. During the interleaving, a column permutation may be performed by swapping the columns using a bit-reversed-order (BRO, hereafter) of their original column number. For example, a BRO of column 3 (binary 011) in an eight-column block interleaver becomes column 6 (binary 110). In essence, column 3 becomes column 6. For some embodiments, no column permutation is one of many possible permutations. The bit-reversed-order functionality is not essential in the present invention.

The 1st interleaver 40 comprises an initial value generator 43, a BRO operation circuit 44, a 15-bit counter 45, a comparator 46, two switches 47 and 48, a grouping-units block 41, and an interleaved data storage unit 42. The grouping-units block 41 comprises n+1 grouping bits units $41_0$~$41_n$, wherein n is equal to C1−1. In other words, the number of grouping bits units is equal to the total number of columns. The interleaved data storage unit 42 comprises an ending process circuit 420 and a turbo, convolutional TTI buffer 421, and a switch 422.

The initial value generator 43 is coupled to the grouping bits units $41_0$~$41_n$. The grouping bits units $41_0$~$41_n$ are coupled to the ending process circuit 420 and the turbo and convolutional TTI buffer 421. The switch 47 is coupled to the BRO operation circuit 44 and the 15-bit counter 45. The comparator 46 is coupled to the grouping bits units $41_0$~$41_n$, the ending process circuit 420, and the turbo and convolutional TTI buffer 421. The switch 422 is coupled to the ending process circuit 420 and the turbo and convolutional TTI buffer 421.

The interleaver 40 is enabled by the enable signal 1stInterleaver_en. The interleaver 40 receives coded data bits and performs the grouping bits interleaving algorithm, when the interleaver 40 is enabled.

The initial value generator 43 generates a plurality of initial values for the grouping bits units $41_0$~$41_n$, when the initial value generator 43 is triggered to start by the start encoding signal. The initial value for the grouping bits unit $41_0$ is 0 (0*R1). The initial value for the grouping bits unit $41_1$ is R1 (1*R1). By this deduction, the initial value for the grouping bits unit $41_n$ is n*R1.

The BRO operation 44 circuit receives the output m of the 15-bit counter 45, and performs the BRO operation for m. The 15-bit counter 45 receives coded data bits to check if the coded data bits are in the new encoded symbol. If the coded data bits are in the new encoded symbol, the outputs m and k of the 15-bit counter 45 increase by one (i.e. m=m+1, k=k+1); otherwise, the outputs m and k of the 15-bit counter 45 remain the same. The output k of the 15-bit counter 45 is the total symbol count. The output m of the 15-bit counter 45 is the symbol count modulo C1.

If C1=1, the BRO operation circuit 44 will not work. If C1=2, the BRO operation circuit 44 will do 1-bit BRO operation for m, wherein m has 1 bit. If C1=$2^x$, the BRP operation circuit 44 will do x-bit BRO operation for m, wherein m has x bits. The output of the BRO operation circuit 44 is the result of the BRO operation for m, wherein the output of the BRO operation circuit 44 is denoted as i=BRO(m).

The comparator 46 compares the total symbol count k with Ei. If the k≧Ei, the output signal StateCtrl of the comparator 46 is enabled. The signal StateCtrl is used to control the grouping bits units 41 for sending the read address or write address to the turbo and convolutional TTI buffer 421. The signal StateCtrl is also used to enable the ending process circuit 42 and control the switch 422.

The switch 47 and 48 are controlled by the output i of the BRO operation circuit 44. In other word, the switch 47 sends one of the coded data bits to one of the corresponding grouping bits units $41_0 \sim 41_n$ according to the output i of the BRO operation circuit 44. The switch 48 selects similarly one of the corresponding grouping bits units $41_0 \sim 41_n$.

Each of the grouping bits units $41_0 \sim 41_n$ is used to generate a write address, and temporarily store the coded data bits. The structures of each grouping bits unit $41_0 \sim 41_n$ are the same. Here, take grouping bits unit $41_0$ for illustration. The grouping bits unit $41_0$ comprises a TTI buffer address calculator 4100, a 15-bit counter 4101, a 16-bit register bank 4102, a bit position calculator 4103, a comparator 4104, and switch 4105.

The 15-bit counter 4101 is coupled to the TTI buffer address calculator 4100, the 16-bit register bank 4102, the bit position calculator 4103, and the comparator 4104. The 16-bit register bank 4102 is coupled to the switch 4105 and the bit position calculator 4103. The switch 4105 is coupled to the comparator 4104.

The 15-bit counter 4101 receives one of the initial values as a starting number of the 15-bit counter 4101 from the initial value generator 43. The 15-bit counter 4101 receives the coded data bits via the switch 47 and checks if the coded data bits are in the new encoded symbol. If the coded data bits are in the new encoded symbol, the output SymCount(0) of the 15-bit counter 4101 increases by one (i.e. SymCount(0) =SymCount(0)+1); if not, the output SymCount(0) of the 15-bit counter 4101 remains the same. As stated above, the initial value for the grouping bits unit 410 is 0.

The bit position calculator 4103 calculates a bit position to the 16-bit register bank 4102. The bit position is equal to 15–j, wherein j is the four least significant bits (LSBs, hereafter) presented decimally (i.e. j=SymCount(0)[3:0]). The 16-bit register bank 4102 is used to store the coded data bits according to the bit position. The 16-bit register bank 4102 is composed of 16 one-bit registers. The bit position is used to indicate which one register of the 16-bit register bank 4102 to store the bit of the coded data bits.

The comparator 4104 compares j and the value 15, if j=15, the output of the comparator 4104 is enabled; otherwise the output of the comparator 4104 is disabled. The switch 4105 is controlled by the output of the comparator 4104. The comparator may compare j with the other positive value less than the bits number of the 16-bit register bank 4102. In the embodiment this value is 15, but it is not intended to limit the scope of the invention.

In response to the output of the comparator 4104 is enabled, the 16-bit register bank 4102 dumps stored data bits to the ending process circuit 420 and the turbo and convolutional TTI buffer 421 via the switch 422. The TTI buffer address calculator 4100 calculates the write address and outputs the write address to the turbo and convolutional TTI buffer 421 in response to the signal StateCtrl is disabled; in response to the signal StateCtrl is 1, the TTI buffer address calculator 4100 calculates the write address and the read address and outputs the write address to the turbo and convolutional TTI buffer 421. The write address and the read address are the base address initialized by the external setting plus SymCount(0)[14:4].

When StateCtrl is disabled, the switch 422 selects the stored data bits in the 16-bit register bank 4102 as the output of the switch 422; when StateCtrl is enabled, the switch 422 selects the output of the ending process circuit 420 as the output of the switch 422. The turbo and convolutional TTI buffer 421 outputs its stored data according the read address and stores the output of the switch 422 according to the write address.

The ending process circuit 420 comprises a 16-bit register bank 4200 and a plurality of or-gates 4201. Wherein the 16-bit register bank 4200 is coupled to the or-gates 4201. The ending process circuit 420 is enabled when StateCtrrl is enabled. The 16-bit register bank 4200 reads the stored data of the turbo and convolutional TTI buffer 421 according the read address. The OR-gates 4201 do the OR-operation for the output of the switch 4105 and the output of the 16-bit register bank 4200.

As stated above, the structures of the grouping bits units $41_0 \sim 41_n$ are the same. The functions of the grouping bits units $41_0 \sim 41_n$ are similar. For the grouping bits units $41_i$ and $41_0$, the difference is SymCount(0) as stated above and SymCount (i). In other word, the function of the grouping bits unit $41_i$ is same as stated above, except for using SymCount(i) to substitute for SymCount(0).

Figure 4:
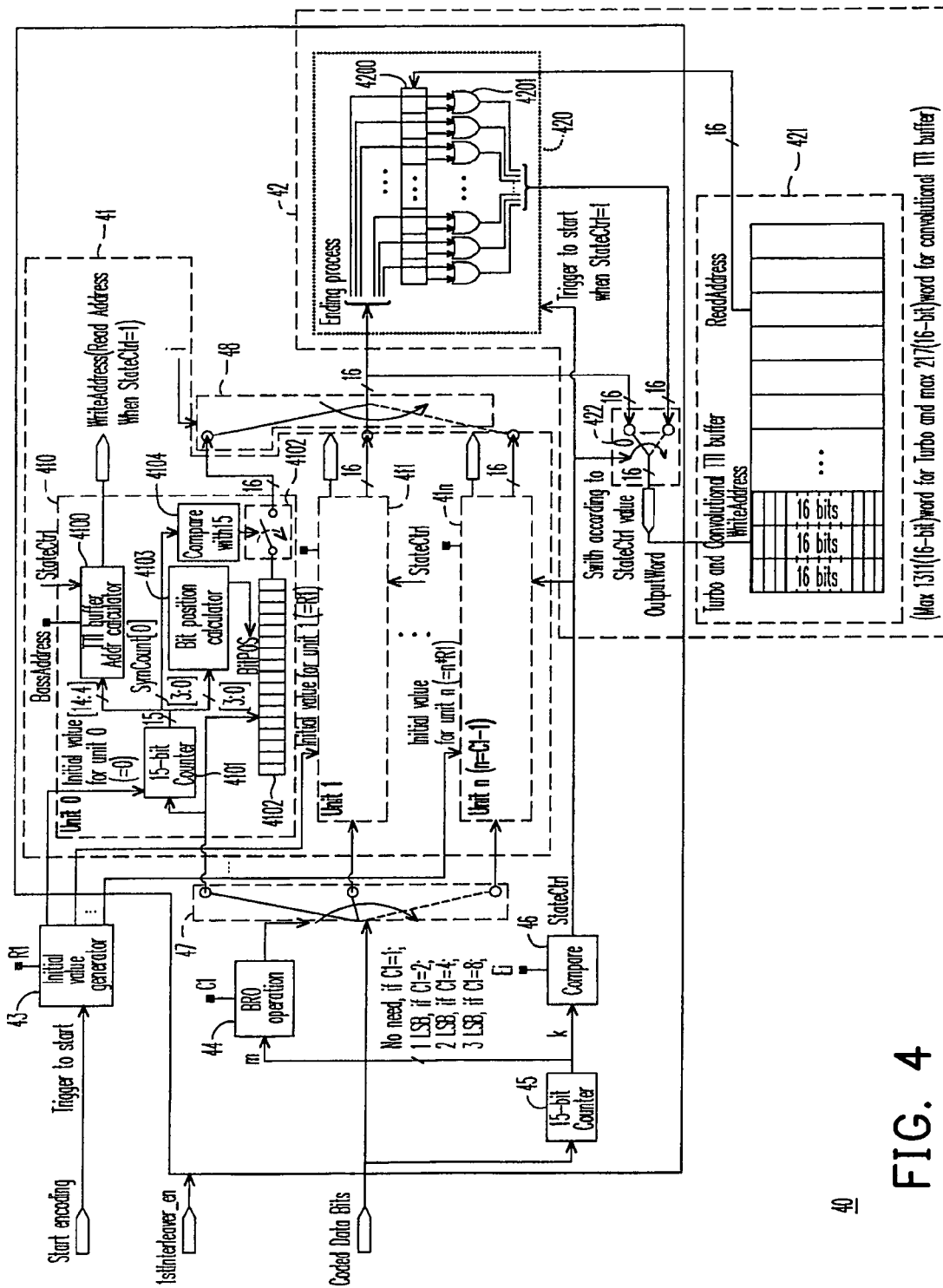
FIG. 4 is a block diagram showing the application of the invention in the 1st interleaver 40 of WCDMA according to the spec TS 25.212.
Figure 5:
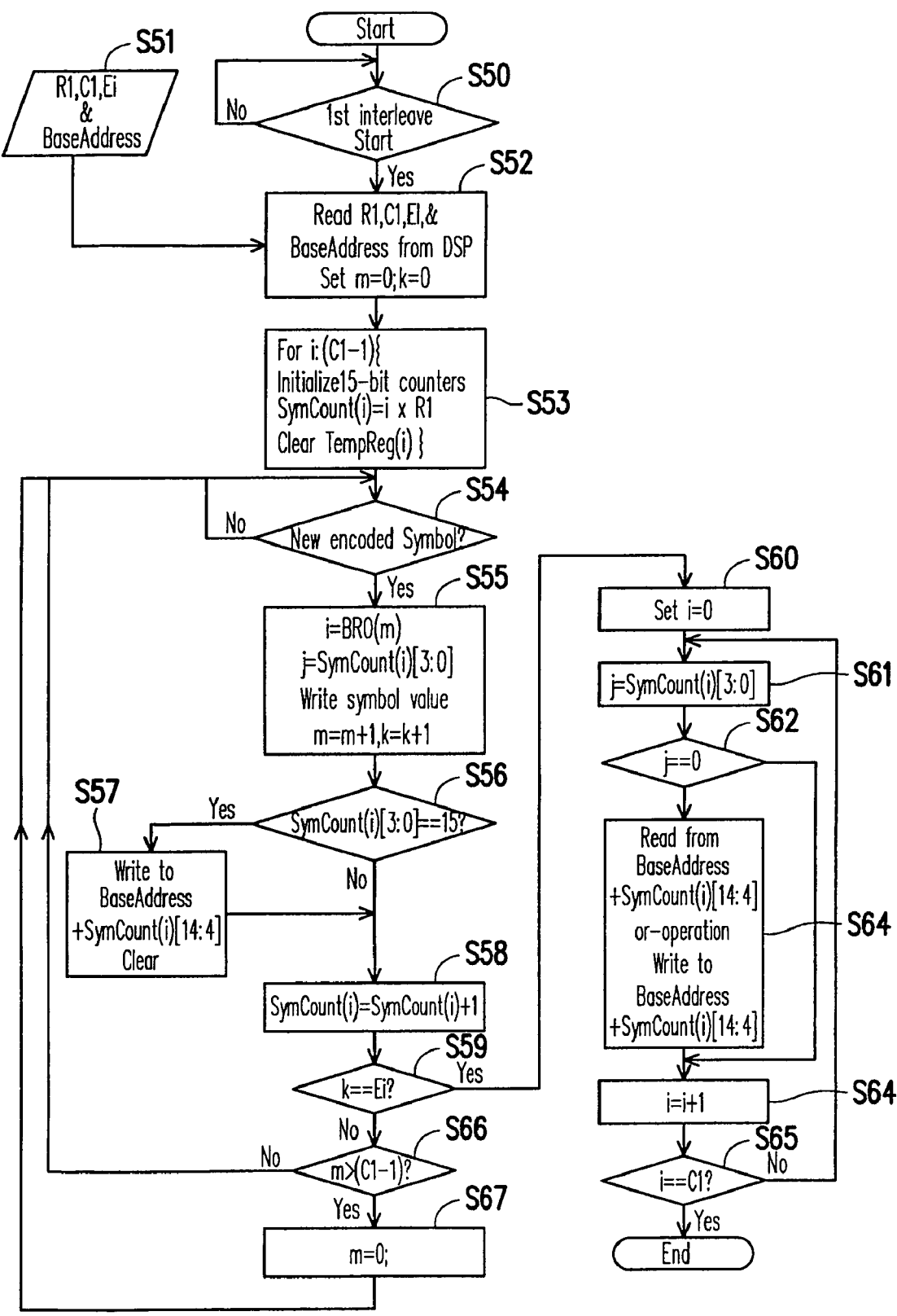
FIG. 5 is a flow chart showing the implementation of FIG. 4.

Please see FIG. 5, which is a flow chart showing the implementation of FIG. 4. In step S50, check whether the enable signal 1stInterleaver_en is enabled. If the enable signal 1stInterleaver_en is enabled, the next step S52 will be executed; otherwise, still check whether the enable signal 1stInterleaver_en is enabled. In step S51 optional to this invention, the parameters R1, C1, Ei, and BaseAddress may be generated by the external setting, such as using a digital signal processing (DSP, hereafter) chip to set these parameters R1, C1, Ei, and BaseAddress. In step S52, the interleaver 40 reads theses parameter from the DSP chip and sets output parameters of the 15-bit counter 45 as m=0 and k=0. In step S53, initialize the 15-bit counters of the grouping units $41_0 \sim 41_n$ by the initial value generator 43, and clear the 16-bit register banks (TempReg) 4102 of the grouping units $41_0 \sim 41_n$. The initial value of SymCount(i) is i*R1. As stated above, the SymCount(i) is used to control write address and write times.

In step S54, check whether the coded data bits are in the new encoded symbol. If the coded data bits are in the new encoded symbol, the next step S55 will be executed; otherwise, repeat checking whether the coded data bits are in the new encoded symbol. In other words, if a new encoded symbol is sent from the FEC encoder, the next step S55 will be executed. In the step S55, do the BRO operation for m, i.e. i=BRO(m), wherein m is the total symbol count k modulo C1; j is assigned to SymCount(i)[3:0], then the bit position is 15–j, and the bit of the coded data bits is written into the 16-bit register bank of the grouping bits unit $41_i$ according to the bit position; finally increase m and k by 1 (i.e. m=m+1, k=k+1).

In step S56, check whether SymCount(i)[3:0] is equal to 15.I If SymCount(i)[3:0] is equal to 15, the next step S57 will be executed; otherwise, the next step S58 will be executed. In step S57, write the data stored in the 16-bit register bank of the grouping bits unit 410i into the turbo and convolutional TTI buffer 421 according to the write address, and clear the 16-bit register bank of the grouping bits unit $41_j$. Wherein the write address is BaseAddress plus SymCount(i)[14:4]. In step S58, increase SymCount(i) by one (i.e. SymCount(i)=SymCount(i)+1).

In step S59, check whether k is equal to Ei. If k is equal to Ei, the next step S60 will be executed; otherwise the next step S66 will be executed. In step S66, check whether m is larger than C1−1. If m is larger than C1−1, the next step S67 will be executed; otherwise, go back to step S54. In step S67, m is set to be 0.

In step S60, index i is set to be 0. In step S61, j is assigned to be SymCount(i)[3:0]. In step S62, check whether j is equal to 0. If j is equal to 0, the next step S64 will be executed; otherwise the next step S63 will be executed. In step S63, read the data stored from the turbo and convolutional TTI buffer 421 according to the read address into the 16-bit register bank 4200; do the OR-operation for data stored in the 16-bit register bank 4200 and the output of the switch 48; finally write the result of OR-operation into the turbo and convolutional TTI buffer 421 according to the write address. In which the write address and the read address are the same, and the address equals the sum of BaseAddress plus SymCount(i)[14:4]. In step S64, increase i by one (i.e. i=i+1). In step S65, check if i is equal to C1, if i is equal to C1, the grouping bits interleaving algorithm is finished; otherwise, go back to step S61.

In one embodiment, steps S60~S65 are executed by the ending process circuit 420. The ending process circuit 420 will improve the efficiency of the memory usage of the turbo and convolutional TTI buffer 421. In some circumstances, the ending processing circuit 420 and BRO operation circuit 44 may be removed for some requirement. The embodiments shown in FIGS. 4~5 are not intended to limit the scope of the invention.

Below, two examples are provided to explain the working procedure of the 1st interleaver with grouping bits design. Please see FIGS. 6~9, which are schematic diagrams showing the steps of the 1st interleaver with grouping bits design. In FIGS. 6~9, assuming 16 bits per word for storage units, and 4 grouping bits units are used. Each of the 4 grouping bits units has a 16-bit register bank TempReg(0)~TempReg(3) respectively. In the example, Ei is 68, C1 is 4, R1 is 7, and BaseAddress is 0. For the term "X/Y" denoted the coded data bits 60, X means the input sequence of the data before interleaving, and Y means the output sequence of the interleaved data.

Figure 6:
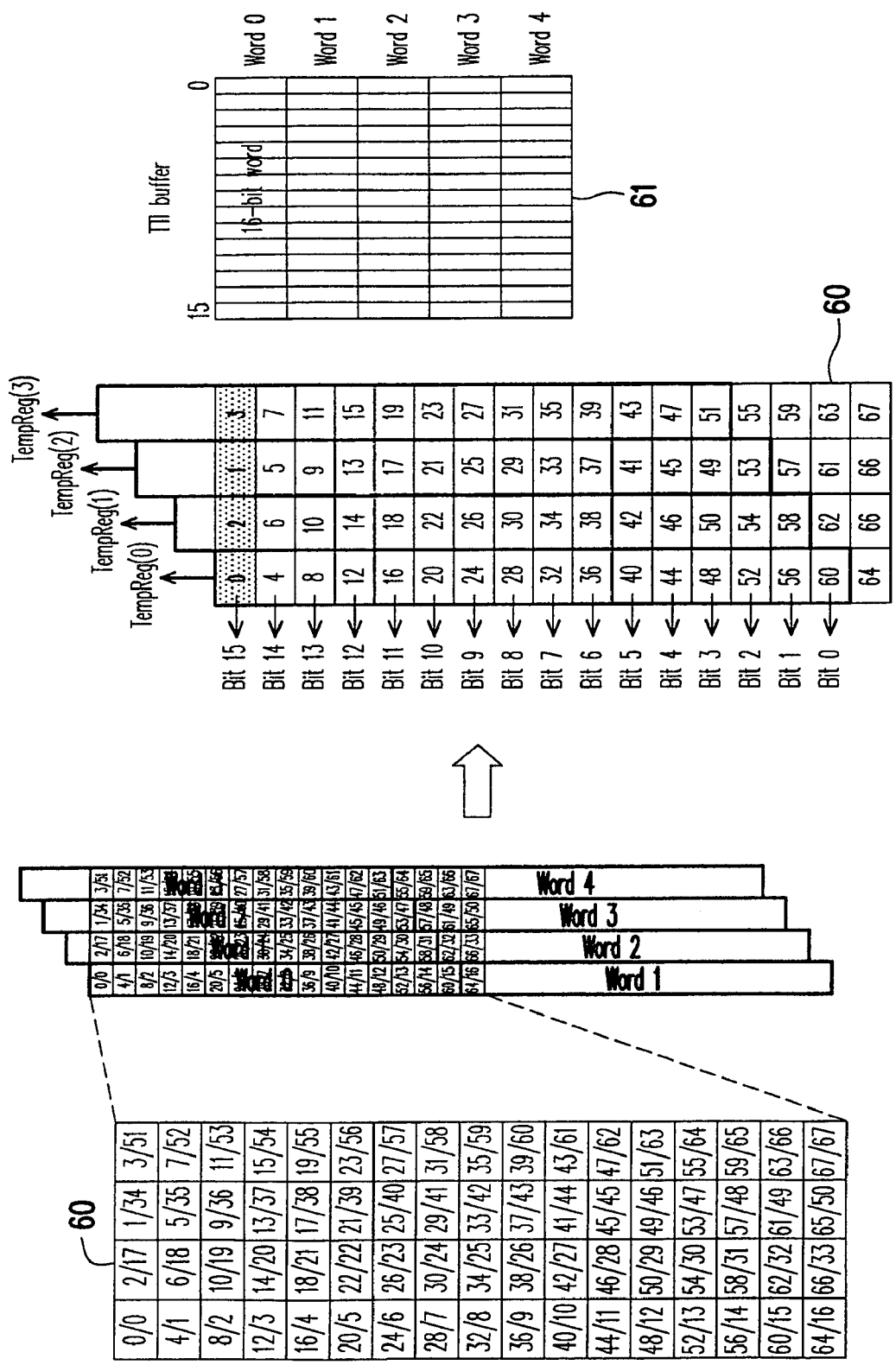
FIGS. 6~9 are schematic diagrams showing the steps of the 1st interleaver with grouping bits design.
Figure 7:
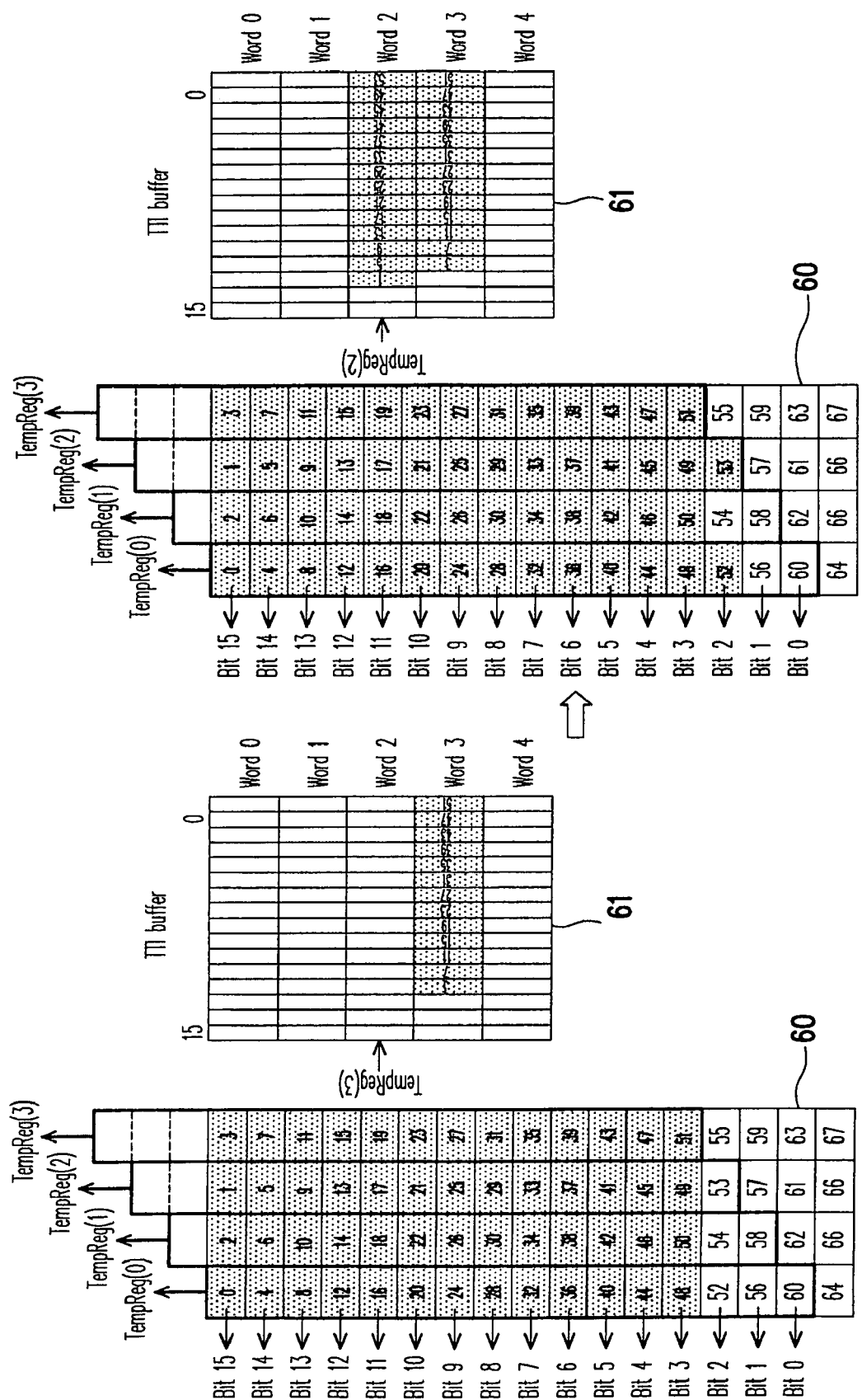

In FIG. 6, the data with sequence number 0, 2, 1 and 3 before interleaved are stored into the 16-bit register bank TempReg(0)~TempReg(3) respectively. In FIG. 7, the data with sequence number 3, 7, 11, . . . , 51 stored in the 16-bit register bank TempReg(3) are written into the TTI buffer 61 as word 3. Then the data with sequence number 1, 5, 9, . . . , 53 stored in the 16-bit register bank TempReg(2) are written into the TTI buffer 61 as word 2.

Figure 8:
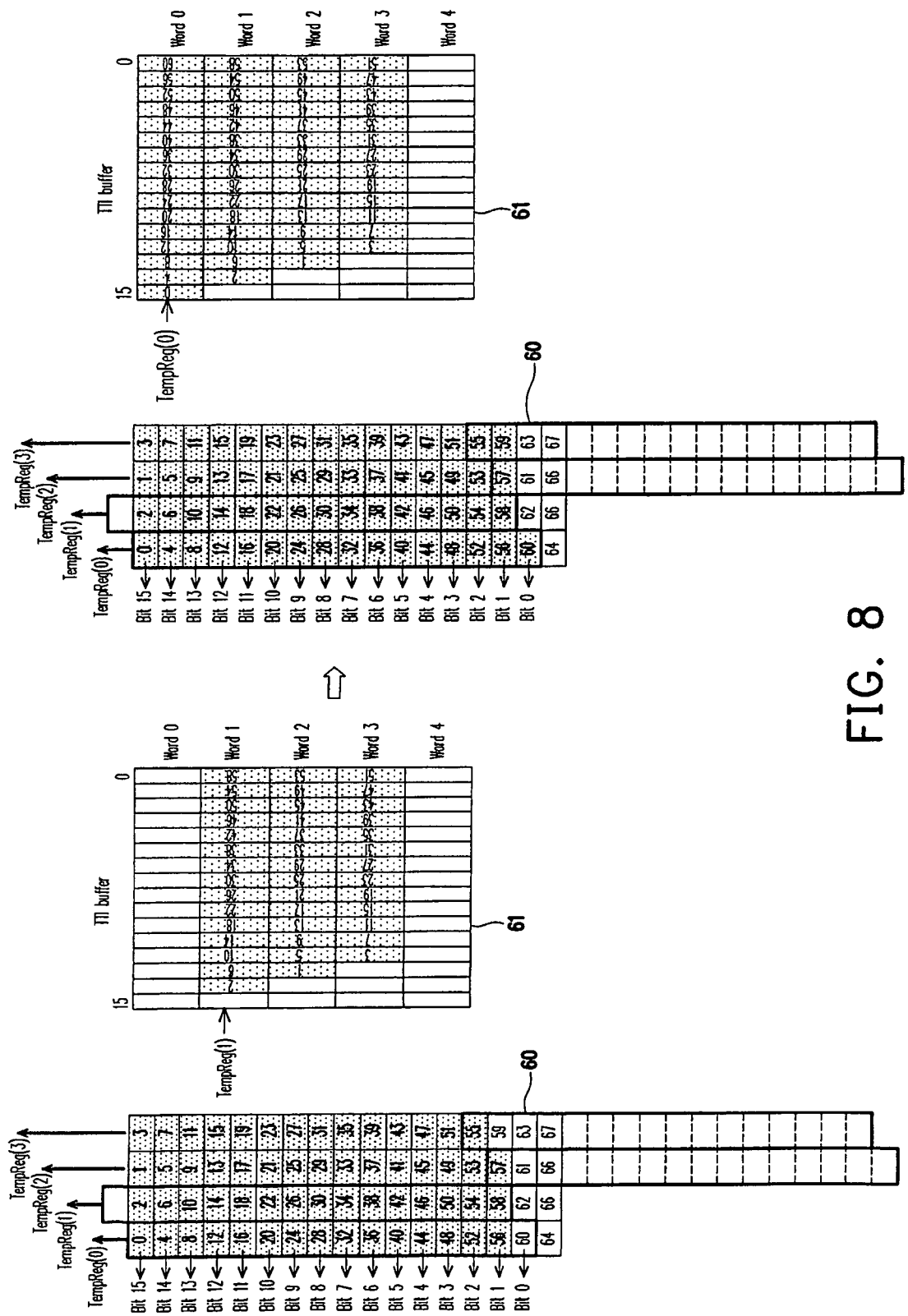

In FIG. 8, the data with sequence number 2, 6, 10, . . . , 58 stored in the 16-bit register bank TempReg(1) are written into the TTI buffer 61 as word 1. Then the data with sequence number 0, 4, 8, . . . , 60 stored in the 16-bit register bank TempReg(0) are written into the TTI buffer 61 as word 0.

Figure 9:
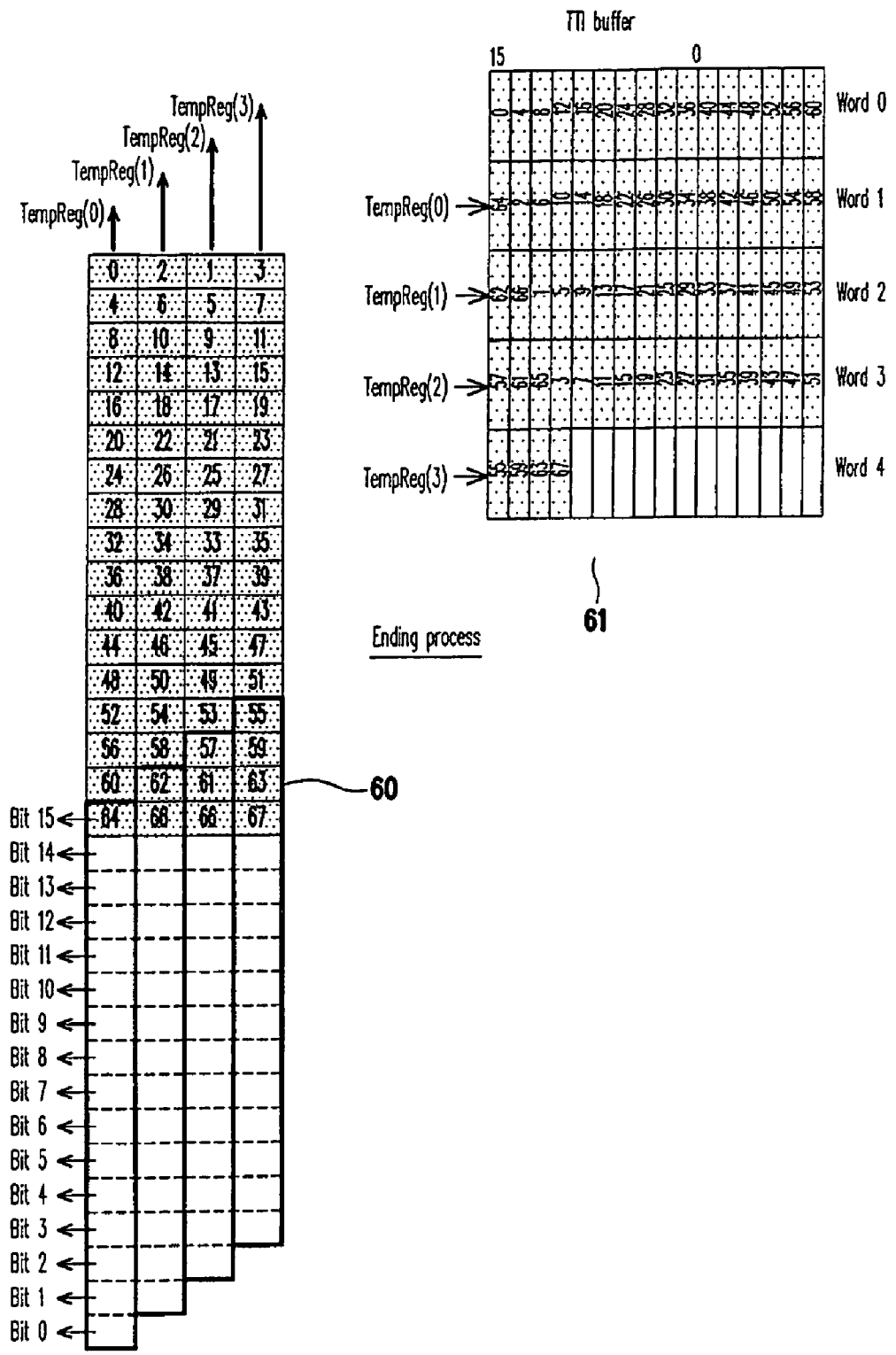

In FIG. 9, the ending process is executed, thus the efficiency of memory usage of the TTI buffer 61 is improved. First, do the or-operation for the data with sequence number 64 stored in the 16-bit register bank TempReg(0) and the data word 1, and write the result of the or-operation into the TTI buffer 61 as word 1. Thus, the data word 1 is composed of the data with sequence number 64, 2, 6, 10, . . . , 58. Second, do the or-operation for the data with sequence number 62, 66 stored in the 16-bit register bank TempReg(1) and the data word 2, and write the result of the or-operation into the TTI buffer 61 as word 2. Thus, the data word 2 is composed of the data with sequence number 62, 66, 1, 5, 9, 13, . . . , 53. Third, do the or-operation for the data with sequence number 57, 61, 65 stored in the 16-bit register bank TempReg(2) and the data word 3, and write the result of the or-operation into the TTI buffer 61 as word 3. Thus, the data word 3 is composed of the data with sequence number 57, 61, 65, 3, 7, 11, . . . , 51. Last, do the or-operation for the data with sequence number 55, 59, 63, 67 stored in the 16-bit register bank TempReg(3) and the data word 4, and write the result of the or-operation into the TTI buffer 61 as word 4. Thus, the data word 3 is composed of the data with sequence number 55, 59, 63, 67.

Please see FIGS. 10~15, FIGS. 10~15 are schematic diagrams showing the steps of another 1st interleaver with grouping bits design. In FIGS. 10~15, they assume 8 bits per word for storage units, and 4 grouping bits units are used. Each of the 4 grouping bits units has a 8-bits register bank TempReg(0)~TempReg(3) respectively. In the example, Ei is 68, C1 is 4, R1 is 7, and BaseAddress is 0. For the term "X/Y" of the coded data bits 70, X means the input sequence of the data before interleaving, and Y means the output sequence of the interleaved data.

Figure 10:
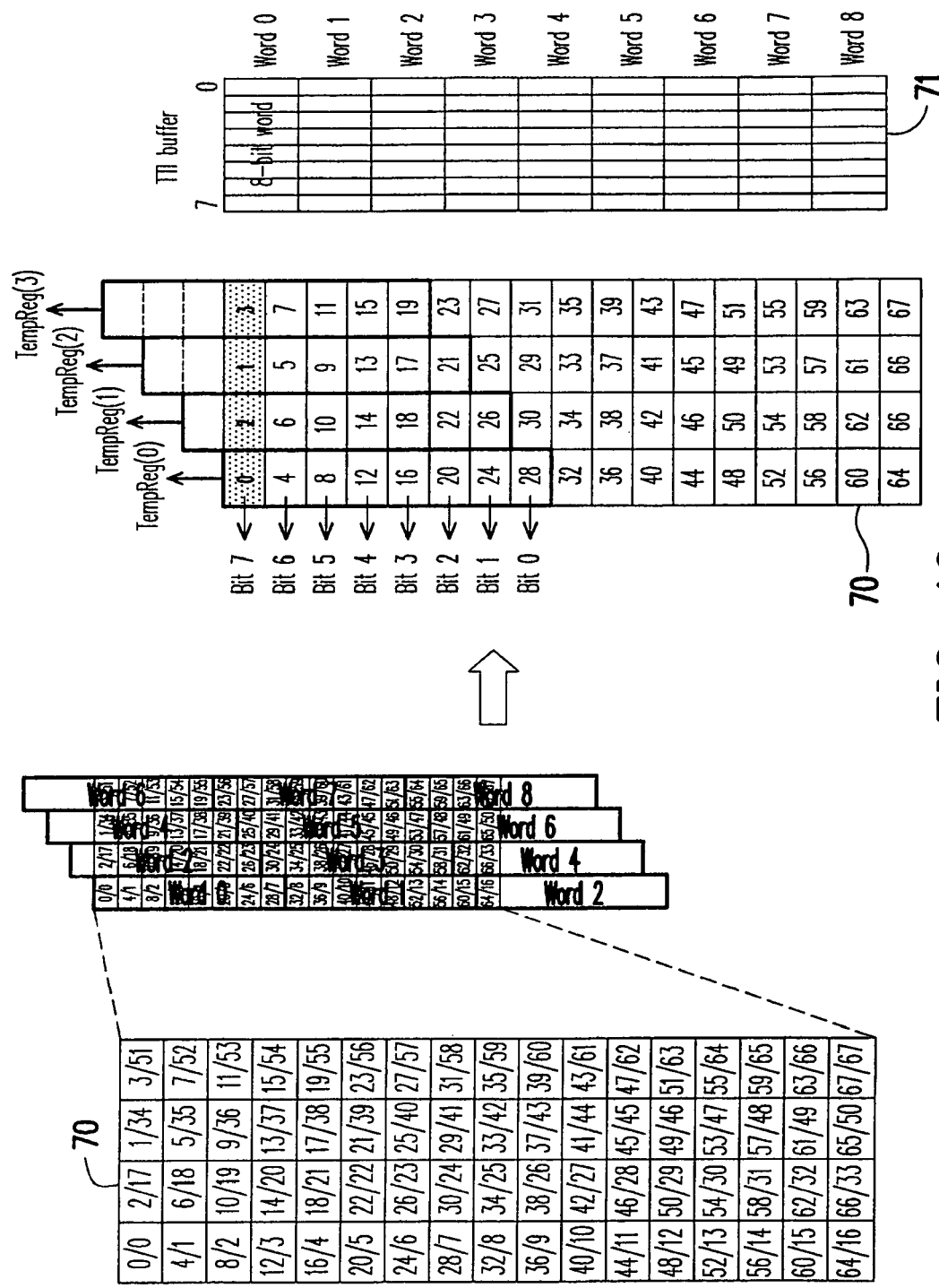
FIGS. 10~15 are schematic diagrams showing the steps of another 1st interleaver with grouping bits design.
Figure 11:
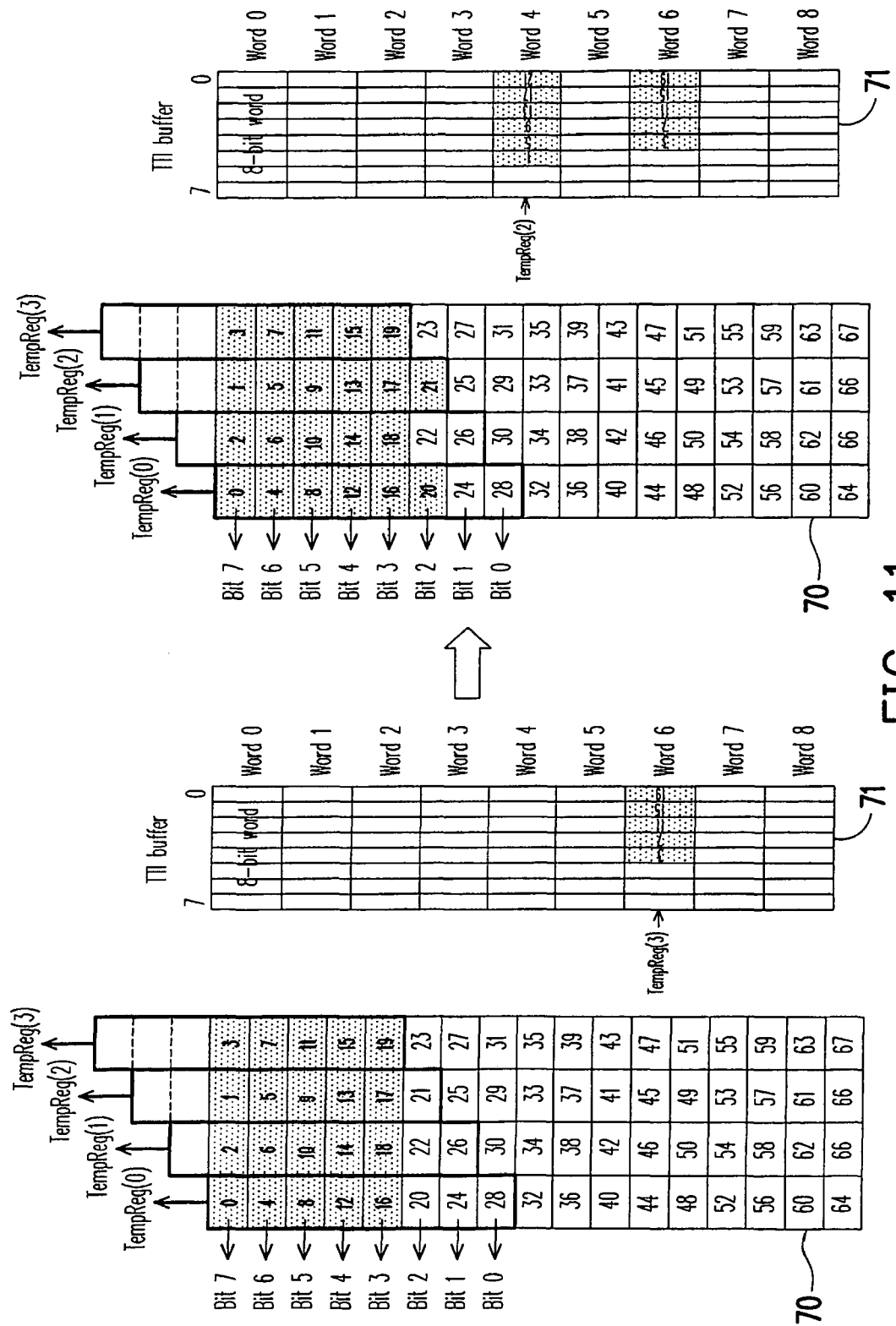

In FIG. 10, the data with sequence number 0, 2, 1 and 3 before interleaved are stored into the 8-bit register bank TempReg(0)~TempReg(3) respectively. In FIG. 11, the data with sequence number 3, 7, 11, 15, 19 stored in the 8-bit register bank TempReg(3) are written into the TTI buffer 71 as word 6. Then the data with sequence number 1, 5, 9, 13, 17, 21 stored in the 8-bit register bank TempReg(2) are written into the TTI buffer 71 as word 4.

Figure 12:
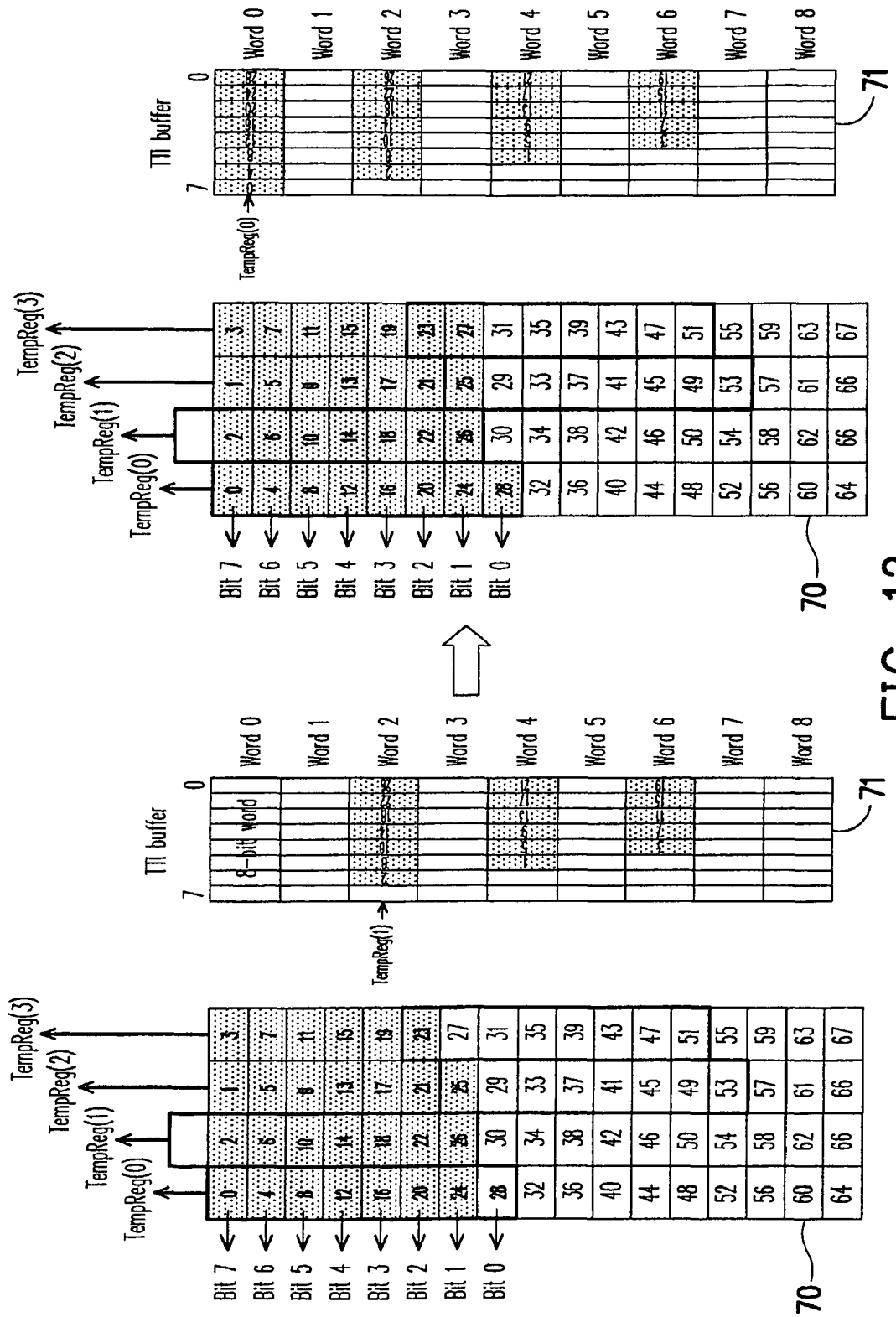

In FIG. 12, the data with sequence number 2, 6, 10, . . . , 26 stored in the 8-bit register bank TempReg(1) are written into the TTI buffer 71 as word 2. Then the data with sequence number 0, 4, 8, . . . , 28 stored in the 8-bit register bank TempReg(0) are written into the TTI buffer 71 as word 0.

Figure 13:
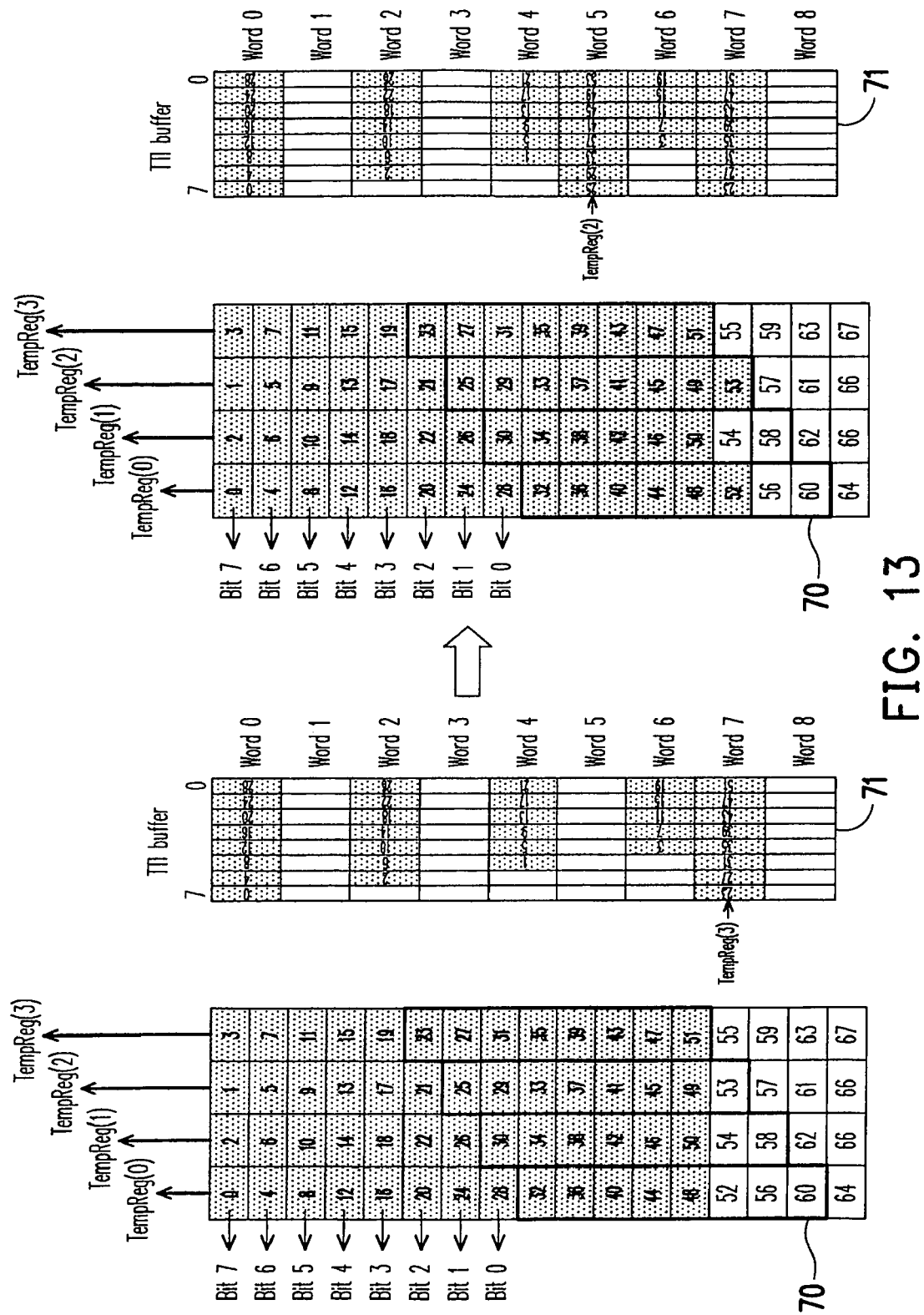

In FIG. 13, the data with sequence number 23, 27, . . . , 51 stored in the 8-bit register bank TempReg(3) are written into the TTI buffer 71 as word 7. Then the data with sequence number 25, 29, . . . , 53 stored in the 8-bit register bank TempReg(2) are written into the TTI buffer 71 as word 5.

Figure 14:
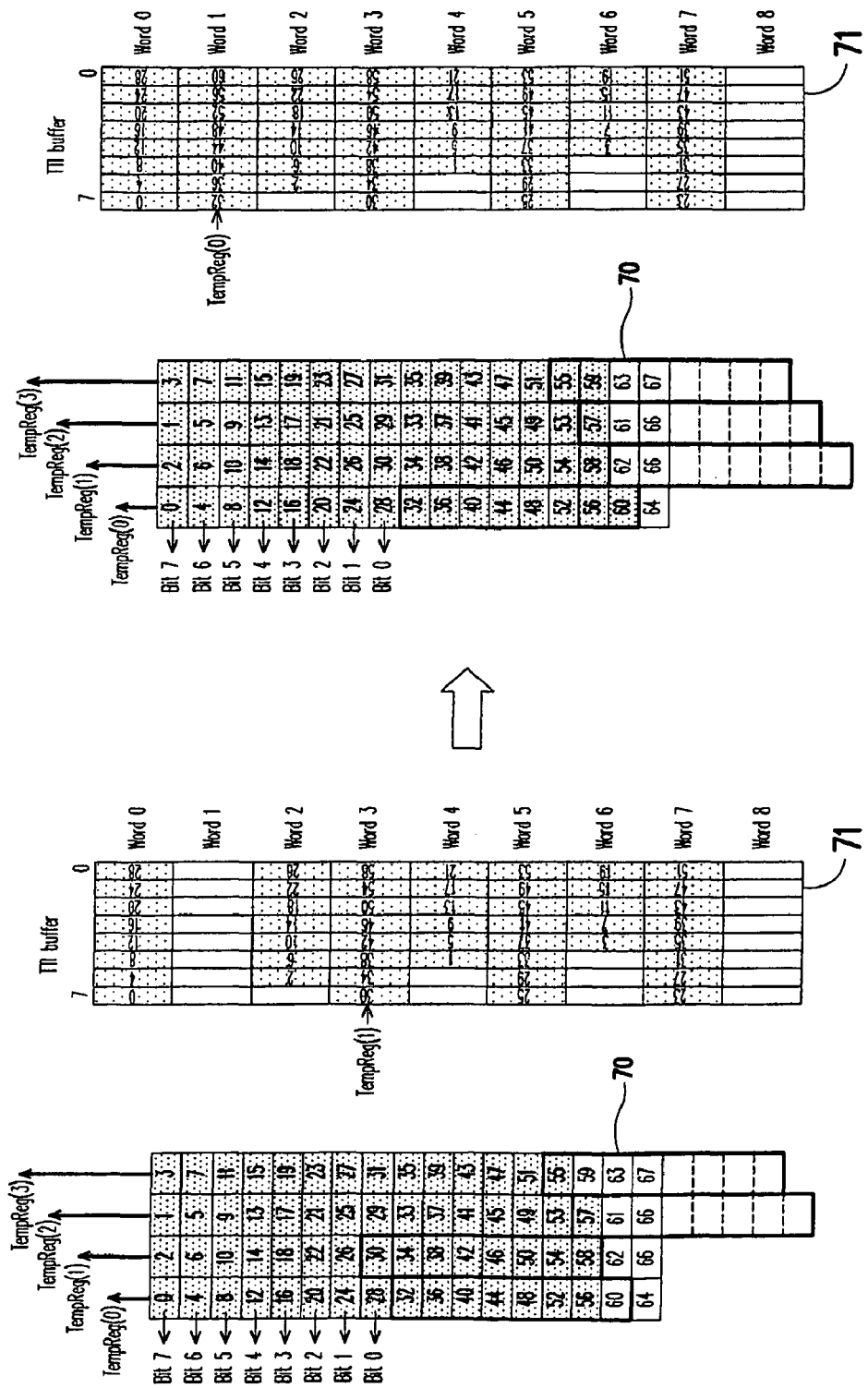

In FIG. 14, the data with sequence number 30, 34, . . . , 58 stored in the 8-bit register bank TempReg(1) are written into the TTI buffer 71 as word 3. Then the data with sequence number 32, 36, . . . , 56 stored in the 8-bit register bank TempReg(0) are written into the TTI buffer 71 as word 1.

Figure 15:
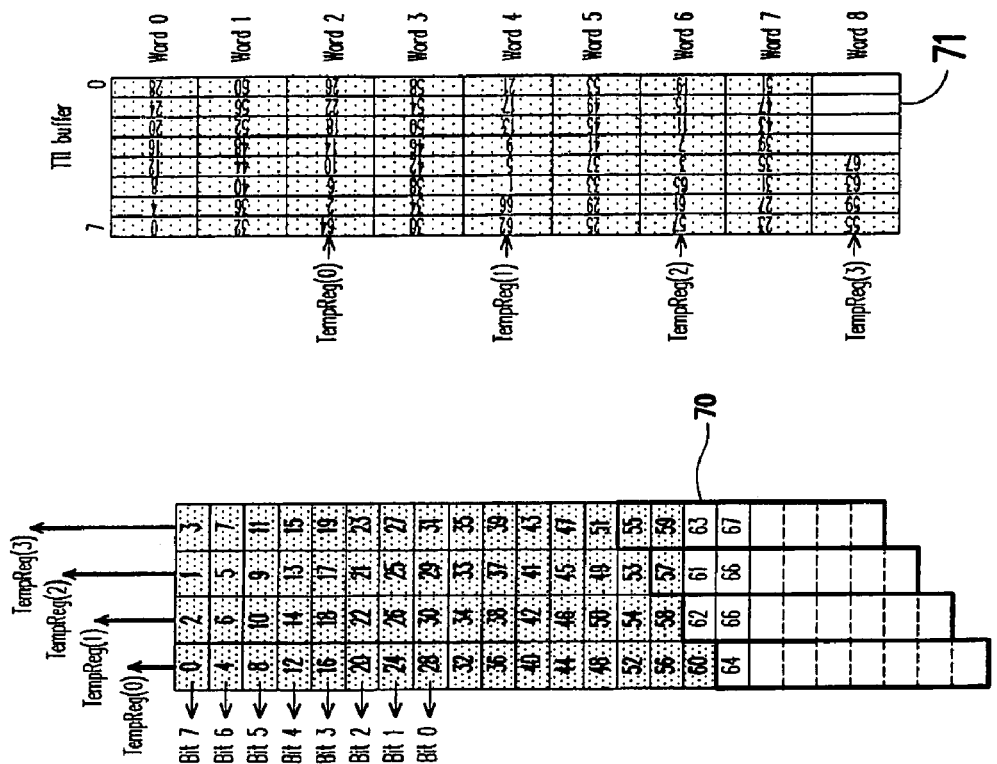

In FIG. 15, the ending process is executed, thus the efficiency of memory usage of the TTI buffer 71 is improved. First, do the or-operation for the data with sequence number 64 stored in the 8-bit register bank TempReg(0) and the data word 2, and write the result of the or-operation into the TTI buffer 71 as word 2. Thus, the data word 2 is composed of the data with sequence number 64, 2, 6, . . . , 26. Second, do the or-operation for the data with sequence number 62, 66 stored in the 8-bit register bank TempReg(1) and the data word, and write the result of the or-operation into the TTI buffer 71 as word 4. Thus, the data word 4 is composed of the data with sequence number 62, 66, 1, 5, . . . , 21. Third, do the or-operation for the data with sequence number 57, 61, 65 stored in the 8-bit register bank TempReg(2) and the data word 6, and write the result of the or-operation into the TTI buffer 71 as word 6. Thus, the data word 6 is composed of the data with sequence number 57, 61, 65, 3, 7, . . . , 19. Last, do the or-operation for the data with sequence number 55, 59, 63, 67 stored in the 8-bit register bank TempReg(3) and the data word 8, and write the result of the or-operation into the TTI buffer 71 as word 8. Thus, the data word 8 is composed of the data with sequence number 55, 59, 63, 67.

Accordingly, in these embodiments, the interleaver provided by the invention use grouping bits design, so as to improve the efficiency of the memory usage. Thus the memory of the grouping bits interleaver does not need a large size memory, and the access times of the memory are reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A grouping bits interleaver, comprising:
    a grouping bits unit, for storing N data bits of an input data and outputting an address signal, wherein N is a positive integer and each data bit is stored according to a corresponding bit position; and
    a data storage unit, coupled to the grouping bits unit, for saving the content of the grouping bits unit according to the address signal;
    wherein the grouping bits unit comprises:
    an address and bit position calculator, for calculating the address signal and the corresponding bit position; and
    a storage unit, coupled to the address and bit position calculator, for storing data bit according to the corresponding bit position, wherein the data storage unit saves the content of the storage unit according to the address signal in response of that the data storage unit is full or the corresponding bit position is equal to a preset value.

2. The grouping bits interleaver as claim 1, wherein the storage unit comprises:
    a N-bit register bank, for storing data bit according to the corresponding bit position.

3. A grouping bits interleaver, comprising:
    n grouping bits units, wherein n is an integer larger than one, each of the n grouping bits units is used to store a plurality of data bits of an input data according to each of n bit positions and to output n address signals, wherein each data bit of the input data is stored according to the corresponding bit position;
    a data storage unit, coupled to the n grouping bits units, for saving content stored in each of the n grouping bits units according to the n address signals, respectively;
    a first switch, coupled to the n grouping bits units, for outputting one data bit of the input data into one of the n grouping bits units according to a first select signal;
    a second switch, coupled to the n grouping bits units and the data storage unit, for outputting the content stored in one of the grouping bits unit to the data storage unit according to the first select signal; and
    a bit-reversed-order (BRO) operation circuit, coupled to the first and second switch, for receiving a plurality of least significant bits of a count signal and outputting the BRO of the least significant bits of the count signal, wherein a number of the least significant bits of the count signal is determined by n,
    wherein the first select signal is the BRO of the least significant bits of the count signal.

4. The grouping bits interleaver of claim 3, further comprising:
    a (N−1)-bit counter, coupled to the BRO operation circuit, for outputting the count signal k, wherein N is a positive integer and the count signal k is a count of the data bits of the input data; and
    a comparator, coupled to the (N−1)-bit counter, for comparing the a predetermined value and the count signal k, wherein the predetermined value is the total number of the data bits Ei.

5. The grouping bits interleaver of claim 4, wherein each of the n grouping bits units comprises:
    an address and bit position calculator, for calculating one of the n address signals and one of the n bit positions; and
    a storage unit, coupled to the address and bit position calculator, for storing the N data bits of the input data according to one of the n bit positions.

6. The grouping bits interleaver of claim 4, wherein the storage unit comprises:
    a N-bit register bank, for storing the N data bits of input data bits according to one of the n bit positions.

7. The grouping bits interleaver of claim 6, wherein the address and bit position calculator comprises:
    a first (N−1)-bit counter, started from a initial value, for counting an input count SymCount of the data bits that input the grouping bits unit;
    a bit position calculator, coupled to the first (N−1)-bit counter, for calculating one of the n bit positions, j=15−SymCount[0:x], wherein SymCount[0:x] is the value of the x+1 least significant bits of the input count SymCount;
    a first comparator, coupled to the bit position calculator, for comparing the SymCount[0:x] with a specified value; and
    a address calculator, for calculating one of the n address signals.

8. The grouping bits interleaver of claim 7, wherein the interleaved data storage unit comprises:
    a buffer, for saving the first data in response to one of the n bit position is equal to one of the n specified values; and
    an ending process circuit, coupled to the buffer, for reading the content of the buffer according to the one of the n address signal, doing a or-operation for the content of the buffer and the content of one of the n grouping bits units to produce a or-operation result, and writing the or-operation result into the buffer according to one of the n address signals; wherein the ending process circuit is enabled when the count signal is equal to the predetermined value.

9. The grouping bits interleaver of claim 8, wherein N is 8, 16, 32, or 64; and the number of the least significant bits of the count signal is 2, 4, or 8, when the n is 1, 3, or 7, respectively.

10. An grouping bits interleaving method, comprising:
    providing n N-bit register banks, wherein both n and N are positive integers;
    providing a (N−1)-bit counter for counting a bit number of data bits of an input data, the bit number of the data bits is k, and the value of the least significant bits of k is m;
    calculating n bit positions for the n N-bit register banks for storing n data bits respectively, and each of the n N-bit register banks stores the data bit according to each of the n bit positions; and
    calculating n address signals when n N-bit register banks are full or the n bit positions are equal to n preset values, and storing the n contents of the n N-bit register banks into a buffer sequentially.

11. The grouping bits interleaving method of claim 10, wherein the step of obtaining the n bit positions comprises:
    doing the BRO of m, the value of the BRO of m is i;
    providing n first (N−1)-bit counters with n differenet initial values; and assigning the n bit positions j=SymCount(i)[x:0], i is from 1 to n, and SymCount(i)[x:0] means the value of the (x+1) least significant bits of the count number of the i-th first (N−1)-bit counter.

12. The grouping bits interleaving method of claim 11, wherein the step of the n address signals comprises:
when the SymCount(i)[x:0] is equal to N, the i-th address signal is a base-address plus SymCount(i)[N−1:x+1], wherein SymCount(i)[N−1:x+1] means the value of the most significant bits of the count number of the i-th first (N−1)-bit counter from (N−1) to x+1.

13. The grouping bits interleaving method of claim 12, wherein N is 8, 16, 32 or 64, and x is 3 when N is 16.

14. The grouping bits interleaving method of claim 11, wherein the bit number of m is determined according to n, when n is 1, 2, or 7, the bit number of m is 1, 2, or 3, respectively.

15. The grouping bits interleaving method of claim 11, further comprising:
when k is equal to the total bit number of the input data, the n address signals are calculated, and the n contents of the buffer are read according to n address signals;
acquiring the n contents of the n (N−1)-bits register banks to do the or-operation with the n contents read from buffer to generate n operation results; and
writing the n operation results according the n address signals.

* * * * *